US011972785B2

(12) United States Patent
Hashemi et al.

(10) Patent No.: US 11,972,785 B2
(45) Date of Patent: Apr. 30, 2024

(54) MRAM STRUCTURE WITH ENHANCED MAGNETICS USING SEED ENGINEERING

(71) Applicant: International Business Machines Corporation, Armonk, NY (US)

(72) Inventors: Pouya Hashemi, Purchase, NY (US); Jonathan Zanhong Sun, Shrub Oak, NY (US); Guohan Hu, Yorktown Heights, NY (US); Saba Zare, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 17/526,646

(22) Filed: Nov. 15, 2021

(65) Prior Publication Data

US 2023/0154513 A1 May 18, 2023

(51) Int. Cl.
| | |
|---|---|
| *G11C 11/16* | (2006.01) |
| *H01F 10/32* | (2006.01) |
| *H10B 61/00* | (2023.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC ........ *G11C 11/161* (2013.01); *H01F 10/3272* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC ... G11C 11/161; H01F 10/3272; H10B 61/00; H10N 50/01; H10N 50/10; H10N 50/80; H10N 50/85
See application file for complete search history.

(56) References Cited

U.S. PATENT DOCUMENTS

| | | | |
|---|---|---|---|
| 8,703,237 B2 | 4/2014 | Park et al. | |
| 9,276,195 B2 | 3/2016 | Kanaya et al. | |
| 10,439,132 B2 | 10/2019 | Iwata et al. | |
| 10,573,449 B2 | 2/2020 | Sasaki | |

(Continued)

FOREIGN PATENT DOCUMENTS

| | | |
|---|---|---|
| EP | 1306850 A2 | 5/2003 |
| JP | 2020035792 A | 3/2020 |

(Continued)

OTHER PUBLICATIONS

International Search Report dated Feb. 20, 2023, received in a corresponding foreign application, 13 pages.

*Primary Examiner* — Jerome Leboeuf

(74) *Attorney, Agent, or Firm* — Scully, Scott, Murphy & Presser, P.C.; Daniel P. Morris, Esq.

(57) ABSTRACT

A memory structure, i.e., magnetoresistive random access memory (MRAM) structure, is provided that includes a seeding area including at least a tunnel barrier seed layer located beneath a chemical templating layer that is wider than the magnetic tunnel junction (MTJ) structure that is located on the chemical templating layer. Redeposited metallic material is located on at least a sidewall of the tunnel barrier seed layer of the seeding area so as to shunt that area of the structure. The memory structure has reduced resistance with minimal tunnel magnetoresistance (TMR) loss penalty.

21 Claims, 6 Drawing Sheets

(56) References Cited

U.S. PATENT DOCUMENTS

| | | | |
|---|---|---|---|
| 10,614,866 B2 | 4/2020 | Sasaki et al. | |
| 10,777,742 B2 | 9/2020 | Choi et al. | |
| 10,862,023 B2 | 12/2020 | Peng et al. | |
| 10,892,400 B2 | 1/2021 | Noh et al. | |
| 2003/0030944 A1* | 2/2003 | Lin | B82Y 10/00 |
| 2003/0214837 A1 | 11/2003 | Smith et al. | |
| 2014/0015076 A1* | 1/2014 | Gan | H01F 10/329 |
| | | | 257/421 |
| 2017/0148976 A1 | 5/2017 | Annunziata et al. | |
| 2020/0119264 A1 | 4/2020 | Yang et al. | |
| 2020/0365795 A1 | 11/2020 | Chuang et al. | |
| 2021/0036054 A1 | 2/2021 | Gallagher et al. | |
| 2022/0165939 A1* | 5/2022 | Jeong | H01F 10/3272 |
| 2022/0367789 A1* | 11/2022 | Chuang | H10N 50/01 |

FOREIGN PATENT DOCUMENTS

| | | | |
|---|---|---|---|
| WO | 2017155508 A1 | 9/2017 | |
| WO | 2019005082 A1 | 1/2019 | |

* cited by examiner

MRAM STRUCTURE WITH ENHANCED MAGNETICS USING SEED ENGINEERING

BACKGROUND

The present application relates to a memory structure, and more particularly to a magnetoresistive random access memory (MRAM) structure including an increased seeding area with intentional shunting to overcome resistance and tunnel magnetoresistance (TMR) penalty.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier layer). One of the two plates (i.e., the magnetic reference or pinned layer) is a magnet whose magnetic moment direction is set to a particular direction; the other plate's (i.e., the magnetic free layer's) magnetization can be changed in at least two different directions, representing different digital states such as 0 and 1 for memory applications. In MRAMs, such elements may be referred to as a magnetic tunnel junction (MTJ) structure. In a typical MTJ structure, the magnetization of the magnetic reference layer is fixed in one direction (say pointing up), while the direction of the magnetic free layer can be "switched" by some external forces, such as a magnetic field or a spin-transfer torque generating charge current. A smaller current (of either polarity) can be used to read the resistance of the device, which depends on the relative orientations of the magnetizations of the magnetic free layer and the magnetic reference layer. The resistance is typically higher when the magnetizations are anti-parallel, and lower when they are parallel (though this can be reversed, depending on the material).

One type of MRAM that can use a MTJ structure is spin-transfer torque (STT) MRAM. STT MRAM has the advantages of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ structure is used to switch, or "write" the bit-state of the MTJ memory element. A current passing down through the MTJ structure makes the magnetic free layer parallel to the magnetic reference layer, while a current passing up through the MTJ structure makes the magnetic free layer anti-parallel to the magnetic reference layer.

For certain material systems such as ordered magnetic alloys, growing magnetic stacks on top of a relatively thick tunnel barrier seed layer is desired for better deposition control; a thin tunnel barrier seed layer results in magnetic or crystallographic disordering resulting in adverse magnetic properties for a memory cell which is built thereon. However, the use of thick tunnel barrier seed layers in conventional memory structures has a negative impact on TMR due to increased resistance caused by the tunnel barrier seed layer. There is thus a need to provide a memory structure which overcome resistance and the TMR penalty.

SUMMARY

A memory structure, i.e., MRAM structure, is provided that includes a seeding area including at least a tunnel barrier seed layer located beneath a chemical templating layer that is wider than the MTJ structure that is located on the chemical templating layer. Redeposited metallic material is located on at least a sidewall of the tunnel barrier seed layer of the seeding area so as to shunt that area of the structure. The memory structure has reduced resistance with minimal TMR loss penalty.

In one aspect of the present application, a memory structure is provided. In one embodiment of the present application, the memory structure includes a bottom electrode embedded in a first interconnect dielectric material layer. A non-magnetic pedestal structure is located on the bottom electrode and a portion of the first interconnect dielectric material layer. A seeding area having a first width is located on the non-magnetic pedestal structure, wherein the seeding area includes at least a tunnel barrier seed layer. A chemical templating layer is located on the seeding area. A MTJ structure having a second width is located on the chemical templating layer, wherein the second width is less than the first width. A top electrode is located on the MTJ structure, and a layer of non-oxidized metallic residue is located on at least a sidewall of the tunnel barrier seed layer and intentionally shunting at least the seeding area.

In embodiments of the present application, the chemical templating layer has an upper portion and a lower portion, wherein the lower portion has a width that is greater than the upper portion and forms an interface with the tunnel barrier seed layer.

In embodiments of the present application, the memory structure further includes a dielectric spacer located on a sidewall of the MTJ structure and the top electrode, and having a bottommost surface that is located on the lower portion of the chemical templating layer.

In embodiments of the present application, the memory structure further includes an encapsulation layer located laterally adjacent to the dielectric spacer, the seeding area and the non-magnetic pedestal structure, and having a bottommost surface located on a surface of the first interconnect dielectric material layer.

In embodiments of the present application, the memory structure further includes a second interconnect dielectric material layer located laterally adjacent to, and above, the encapsulation layer. In such embodiments, an electrically conductive structure can be embedded in the second interconnect dielectric material layer and the electrically conductive structure contacts the top electrode. Generally, the electrically conductive structure has a third width that is greater than at least the second width of the MTJ structure.

In embodiments of the present application, the layer of non-oxidized metallic residue extends onto a sidewall of the non-magnetic pedestal structure, or extends onto a sidewall of the lower portion of the chemical templating layer and, optionally onto a sidewall of the dielectric spacer. In some embodiments of the present application, the layer of non-oxidized metallic residue extends onto a sidewall of each of the non-magnetic pedestal structure, the lower portion of the chemical templating layer and the dielectric spacer.

In embodiments of the present application, the MTJ structure is a top pinned MTJ structure including, from bottom to top, a magnetic free layer, a tunnel barrier layer and a magnetic reference layer. In some embodiments, the magnetic free layer of the top pinned MTJ structure includes an ordered magnetic alloy such as, for example, a Heusler alloy or a L10 alloy. In some embodiments, the magnetic reference layer of the top pinned MTJ structure is a single magnetic reference layer, while in other embodiments, the magnetic reference layer of the top pinned MTJ structure includes a lower magnetic reference layer, a synthetic antiferromagnetic coupling layer and an upper magnetic reference layer.

In embodiments of the present application, the non-magnetic pedestal structure has a width that is greater than at least the second width of the MTJ structure, and the top electrode has a width that is equal to the second width of the MTJ structure.

In embodiments of the present application, the layer of non-oxidized metallic residue includes at least one metal such as, for example, Ta, that is present in the non-magnetic pedestal structure. In embodiments of the present application, the chemical templating layer is a crystallization setting layer for a magnetic free layer of the MTJ structure. In embodiments of the present application, the bottom electrode and the first interconnect dielectric material layer provide one interconnect level of a multilevel interconnect structure.

In embodiments, the tunnel barrier seed layer has a thickness sufficient to induce magnetic or crystallographic order to a magnetic free layer of the MTJ structure. By "magnetic order" it is meant the magnetic free layer has an electron system that forms local or itinerant magnetic moments and that there is interaction between these moments. By "crystallographic order" it is meant that the magnetic free layer has a specific crystal structure such as, for example, face-centered cubic (FCC) or a body-centered cubic (BCC).

In another aspect of the present application, a method of forming a memory structure is provided. In one embodiment of the present application, the method includes forming a non-magnetic pedestal region on an interconnect level, the interconnect level including a bottom electrode embedded in a first interconnect dielectric material layer. Next, a layer of seed metal, a layer of tunnel barrier seed material, a layer of chemical templating material, a MTJ stack and a top electrode layer are formed on the non-magnetic pedestal region. The top electrode layer, the MTJ stack and an upper portion of the layer of chemical templating material are then subjected to a first patterning process to provide a top electrode, a MTJ structure and an upper portion of a chemical templating layer, respectively, wherein the first patterning process includes an etch that stops on a surface of a lower portion of the layer of chemical templating material. A dielectric spacer is then formed on the lower portion of the layer of chemical templating material and laterally adjacent to the top electrode, the MTJ structure and the upper portion of the chemical templating layer. The lower portion of the layer of chemical templating material, the layer of tunnel barrier seed material, the layer of seed metal and the non-magnetic pedestal region are then subjected to a second patterning process using the dielectric spacer as an etch mask to provide a lower portion of the chemical templating layer, a tunnel barrier seed layer, a seed metal layer, and a non-magnetic pedestal structure, respectively, wherein the second patterning process includes an etch that sputters non-oxidized metallic particles from the non-magnetic pedestal region and redeposits the non-oxidized metallic particles onto a sidewall of at least the tunnel barrier seed layer.

In embodiments of the present application, the method can further include forming an encapsulation layer laterally adjacent to the dielectric spacer, the lower portion of the chemical templating layer, the tunnel barrier seed layer, the seed metal layer, and the non-magnetic pedestal structure. In embodiments of the present application, the method can even further include forming a second interconnect dielectric material layer on the encapsulation layer, wherein the second interconnect dielectric material layer includes an electrically conductive structure embedded therein and contacting a topmost surface of top electrode.

In embodiments of the present application, the etch employed in the second patterning process is an ion beam etch in which an angle of the ion beam etch is from 0° to 45° relative to a planar surface of the interconnect level.

These and other aspects of the present application will become more apparent in the drawings of the present application and in the detailed description that follows.

DETAILED DESCRIPTION

Figure 1:
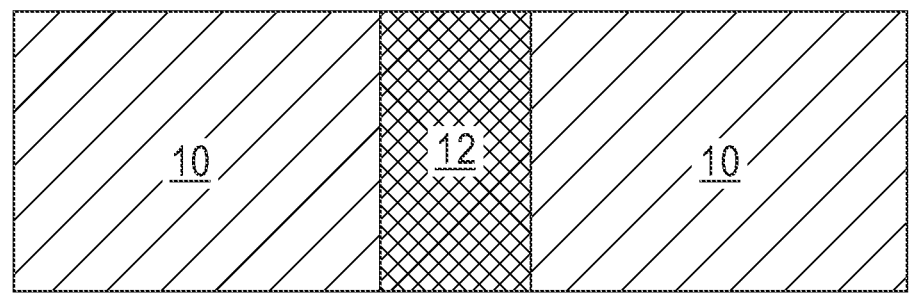
FIG. 1 is a cross sectional view on an exemplary structure that can be used in accordance with an embodiment of the present application, the exemplary structure including an interconnect level including at least one bottom electrode embedded in a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is noted that the drawings of the present application illustrate a memory device area in which a memory structure such as, for example, a MRAM structure, will be formed. A non-memory device area may be located laterally adjacent to the memory device area illustrated in the drawings of the present application. In the present application, the memory structure will be formed in the back-end-of-the-line. The memory structure of the present application can be used in various memory applications including, for example, as a STT MRAM device.

Referring first to FIG. 1, there is illustrated an exemplary structure that can be used in accordance with an embodiment of the present application. The illustrated exemplary structure shown in FIG. 1 includes an interconnect level including at least one bottom electrode 12 embedded in a first interconnect dielectric material layer 10. Although not shown, the bottom electrode 12 contacts a surface of an electrically conductive structure (e.g., a Cu line and/or via) that can also be embedded in the first interconnect dielectric material layer 10, or in another interconnect dielectric material layer that is located beneath the first interconnect dielectric material layer 10.

Although the present application illustrates a single bottom electrode embedded in the first interconnect dielectric material layer 10, the present application is not limited to only a single bottom electrode embedded in the first interconnect dielectric material layer 10. Instead, the present application works when a plurality of spaced apart bottom electrodes are embedded in the first interconnect dielectric material layer 10.

The interconnect level exemplified in FIG. 1 can be located above at least one underlying metal level (not shown) and a front-end-of-the-level (FEOL) also not shown. In some embodiments, the metal level can be a middle-of-the line (MOL) level. In other embodiments, the metal level can be at least one lower interconnect level of a multi-level interconnect structure. In yet further embodiments, the metal level can be a combination of a MOL level and at least one lower interconnect level of a multi-level interconnect structure. The metal level can include electrically conductive structures embedded in a dielectric material layer. The FEOL can include a semiconductor substrate having one or more semiconductor devices (such as, for example, transistors) formed thereon. The metal level and the FEOL can be formed utilizing materials and techniques that are well known to those skilled in the art. So not to obscure the memory structure of the present application, the materials and techniques used in providing the metal level and the FEOL are not described in the present application.

The first interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The first interconnect dielectric material layer 10 can be formed utilizing a deposition process such as, for example, chemical vapor deposition (CVD), plasma enhanced chemical vapor deposition (PECVD) or spin-on coating.

Bottom electrode 12 is composed of a conductive material such as, for example, Ta, TaN, Ti, TiN, Ru, RuN, RuTa, RuTaN, Co, CoWP, CoN, W, WN or any combination thereof. The bottom electrode 12 can have a thickness from 5 nm to 25 nm; other thicknesses are possible and can be used in the present application as the thickness of the bottom electrode 12. The conductive material that provides the bottom electrode 12 can be formed by a deposition process such as, for example, sputtering, CVD, PECVD, atomic layer deposition (ALD) or physical vapor deposition (PVD).

In some embodiments, in which an electrically conductive structure is also embedded in the first interconnect dielectric material layer 10, the bottom electrode 12 can be formed by first recessing the electrically conductive structure that is embedded in the first interconnect dielectric material layer 10 and thereafter the conductive material that provides the bottom electrode 12 is deposited on the recessed surface of the electrically conductive structure that is embedded in the first interconnect dielectric material layer 10. A planarization process such as, for example, chemical mechanical polishing (CMP) can follow the deposition of the conductive material. In yet other embodiments in which the electrically conductive structure is not embedded in the first interconnect dielectric material layer 10, the bottom electrode 12 can be formed in either of the following two ways. In a first way, the first interconnect dielectric material layer 10 is deposited, an opening is formed into the first interconnect dielectric material layer 10 by lithography and etching, the conductive material that provides the bottom electrode 12 is then deposited in the opening, and then an optional planarization process can be employed. In a second way, a conductive material layer is first deposited, the conductive material layer is then patterned by lithography and etching to provide the bottom electrode 12, and thereafter the first interconnect dielectric material layer 10 is deposited and planarized to provide the structure shown in FIG. 1.

The bottom electrode 12 has a topmost surface that is substantially coplanar (within a few Angstroms) with a topmost surface of the first interconnect dielectric material layer 10. The bottom electrode 12 can partially extend through the first interconnect dielectric material layer 12, or the bottom electrode 12 can completely extend through the first interconnect dielectric material layer 10. It is again noted that the bottom electrode 12 is in contact with a lower electrically conductive structure.

Figure 2:
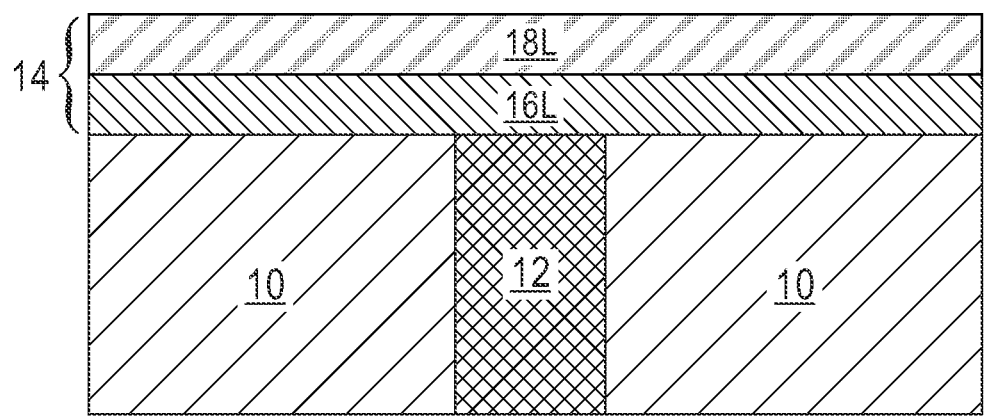
FIG. 2 is a cross sectional view of the exemplary structure shown in FIG. 1 after forming a non-magnetic pedestal region on the interconnect level.

Referring now to FIG. 2, there is illustrated the exemplary structure shown in FIG. 1 after forming a non-magnetic pedestal region 14 on the interconnect level. Notably, the non-magnetic pedestal region 14 is formed on the first interconnect dielectric material layer 10 and the bottom electrode 12. The non-magnetic pedestal region 14 has a smooth uppermost surface that is used in the present application to minimize the roughness in the subsequently formed layers of the exemplary structure.

The non-magnetic pedestal region 14 includes at least one non-magnetic metal-containing layer that is composed of a non-magnetic metal that has a high sticking coefficient that adheres a tunnel barrier seed material and has a low etch rate during a subsequently performed etching process. As known to those skilled in the art, the term sticking coefficient is a term used to describe the ratio of the number of adsorbate atoms (or molecules) that adsorb, or "stick", to a surface to the total number of atoms that impinge upon that surface during the same period of time. Sometimes the symbol SC is used to denote this coefficient, and its value is between 1 (all impinging atoms stick) and 0 (no atoms stick). The coefficient is a function of surface temperature, surface coverage ($\theta$) and structural details as well as the kinetic energy of the impinging particles. In the present application, the term "high sticking coefficient" denotes that the non-magnetic metal(s) that provides the non-magnetic metal pedestal region has(have) a sticking coefficient SC of from 0.5 to 1. The etch rate of a material refers to how fast a material is removed when exposed to an etchant. Etch rate is typically expressed as a ratio of thickness to time (e.g., Å/min) but is occasionally expressed in terms of cycles. Etch rate may be dependent on the geometry, such as feature size or exposed area. In the present application, the term "low etch rate" denotes that the non-magnetic metal has a etch rate of less than 10 Å/min.

Exemplary non-magnetic metals that can be used to provide the non-magnetic pedestal region 14 include, but are not limited to, Ta, TaN, Ti, TiN or multilayered combination thereof. The non-magnetic metals that provide the non-magnetic pedestal region 14 can be compositionally the same as, and/or compositionally different from, the conductive materials mentioned above for the bottom electrode 12. By way of one example, the drawings of the present application illustrate the non-magnetic pedestal region 14 as a multilayered structure that includes a first non-magnetic metal-containing layer 16L and a second non-magnetic metal-containing layer 18L. The first non-magnetic metal-containing layer 16L can composed of a first non-magnetic metal, while the second non-magnetic metal-containing layer 18L can be composed of a second non-magnetic metal that is compositionally different from the first non-magnetic metal. In one example, the first non-magnetic metal-containing layer 16L can be composed of Ti or Ta, while the second non-magnetic metal-containing layer 18L can be composed of TaN or TiN.

The non-magnetic pedestal region 14 can be formed utilizing at least one deposition process including, but not limited to CVD, PECVD, ALD, PVD or sputtering. A planarization process follows the at least one deposition process to provide non-magnetic pedestal region 14 that has a smooth uppermost, i.e., topmost, surface. The non-magnetic pedestal region 14 can have a thickness from 2 nm to 50 nm; although other thicknesses for the non-magnetic pedestal region 14 are contemplated and can be used as the thickness of the non-magnetic pedestal region 14. Note that the individual non-magnetic metal-containing layers (16L, 18L) that provide the non-magnetic pedestal region 14 have thicknesses that are less than the thickness of the non-magnetic pedestal region 14, yet those thickness of the individual non-magnetic metal-containing layers (16L, 18L) add up to the thickness of non-magnetic pedestal region 14.

Figure 3:
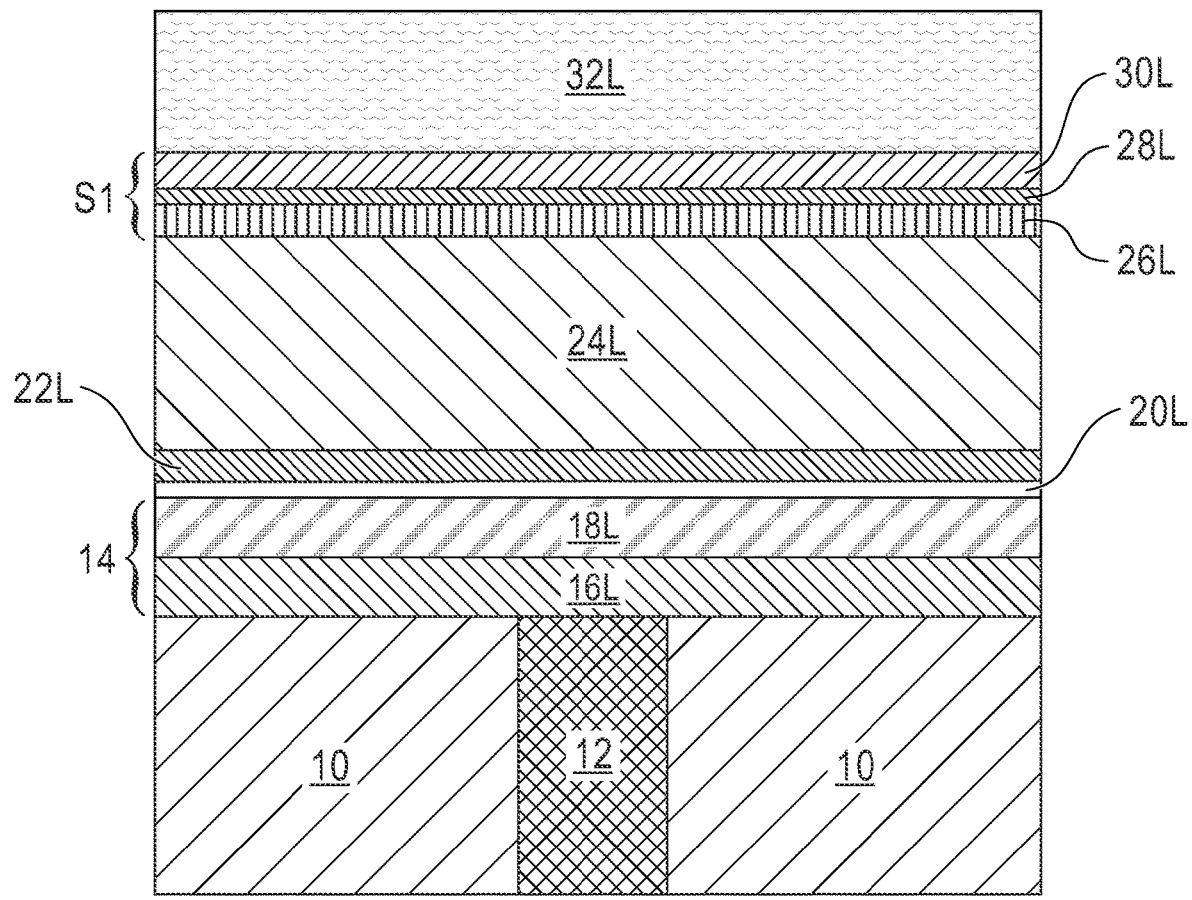
FIG. 3 is a cross sectional view of the exemplary structure shown in FIG. 2 after forming a layer of seed metal, a layer of tunnel barrier seed material, a layer of chemical templating material, a MTJ stack and a top electrode layer on the non-magnetic pedestal region.

Referring now to FIG. 3, there is illustrated the exemplary structure shown in FIG. 2 after forming a layer of seed metal 20L, a layer of tunnel barrier seed material 22L, a layer of chemical templating material 24L, a MTJ stack S1, and a top electrode layer 32L on the non-magnetic pedestal region 14. Collectively, the layer of seed metal 20L and the layer of tunnel barrier seed material 22L provide a seed region of the exemplary structure. The MTJ stack S1 includes a top pinned MTJ stack that includes, from bottom to top, a layer of magnetic free material 26L, a layer of tunnel barrier material 28L, and a layer of magnetic reference material 30L. This top pinned MTJ stack will be subsequently patterned into a top pinned MTJ structure.

Each of the layer of seed metal 20L, the layer of tunnel barrier seed material 22L, the layer of chemical templating material 24L, the MTJ stack S1, and the top electrode layer 32L can be formed be a deposition process including, but not limited to, CVD, PECVD, PVD, ALD or sputtering.

The layer of seed metal 20L, which is formed on the topmost surface of the non-magnetic pedestal region 14, includes a non-magnetic metal that facilitates the growth of the layer of tunnel barrier seed material 22L. Exemplary non-magnetic metals that can be employed as the seed metal include, but are not limited to, Ta, Ti or $Mn_3N$. The layer of seed metal 20L typically has a thickness from 1 nm to 10 nm; although other thicknesses are contemplated and can be used in the present application as the thickness of the layer of seed metal 20L.

The layer of tunnel barrier seed material 22L, which is formed on a topmost surface of the layer of seed metal 20L, has a thickness sufficient to induce magnetic order or crystallographic order to the layer of magnetic free material 26L of the MTJ stack S 1. The tunnel barrier seed material can include, but is not limited to, magnesium oxide, aluminum oxide, or titanium oxide. Typically, the layer of tunnel barrier seed material 22L has a thickness from 0.5 nm to 2 nm. It is noted that the layer of tunnel barrier seed material 22L is a thick seed layer that provides deposition control to the exemplary structure, and helps to facilitate the growth of the subsequently formed layer of chemical templating material 24L.

The layer of chemical templating material 24L, which is formed on a topmost surface of the layer of tunnel barrier seed material 22L, is a crystallization setting layer for the layer of magnetic free material 26L of the MTJ stack S1. That is, the layer of chemical templating material 24L provides a desired crystal structure, e.g., FCC or BCC, to the subsequently formed layer of magnetic free material 26L of the MTJ stack S1. The layer of chemical templating material 24L is composed of a metal alloy such as, for example, CoAl, CoGe, CoGa or CoSn. The layer of chemical templating material 24L typically has a thickness from 1 nm to 10 nm; although other thicknesses are contemplated and can be used in the present application as the thickness of the layer of chemical templating material 24L.

The layer of magnetic free material 26L of the MTJ stack S1, which forms an interface with the underlying layer of chemical templating material 24L, has a magnetization that can be changed in orientation relative to the magnetization orientation of the layer of magnetic reference material 30L. The layer of magnetic free material 26L has a magnetic order and/or crystallographic order, as defined above. The layer of magnetic free material 26L can have a thickness from 0.3 nm to 3 nm; although other thicknesses are possible and can be used as the thickness of the layer of magnetic free material 26L. The layer of magnetic free material 26L can be composed of a magnetic material or a stack of magnetic materials that are well known to those skilled in the art.

In some embodiments, the layer of magnetic free material 26L includes alloys and/or multilayers of cobalt, iron, alloys of cobalt-iron, nickel, alloys of nickel-iron, and alloys of cobalt-iron-boron.

In other embodiments, the layer of magnetic free material 26L is composed of an ordered magnetic alloy. By "ordered magnetic alloy" it is meant a magnetic alloy that has a lattice structure in which atoms of one element occupy particular sites and atoms of at least one other element occupy other sites. In one embodiment, the ordered magnetic alloy that provides the layer of magnetic free material 26L is a Heusler alloy. The term "Heusler alloy" is used herein to denote an intermetallic ternary compound of the formula $X_2YX$, which possesses the Heusler of half-Heusler crystal structure. Exemplary Heusler alloys that can be used in the present application include, but are not limited to, $Mn_3Ge$, $Mn_3Ga$, $Co_2MnSi$, $Mn_3Sn$ or $Mn_3Sb$. In another embodiment, the ordered magnetic alloy that provides the layer of magnetic free material 26L is a L10 alloy. The term "L10 alloy" denotes an intermetallic compound with a body centered tetragonal crystal structure wherein one element occupies the corners of the lattice cell, and the other element occupies the body center. Exemplary L10 alloys that can be used in the present application include, but are not limited to, MnAl or CoFe.

The layer of tunnel barrier material 28L is composed of an insulator material and is formed at a thickness sufficient to provide an appropriate tunneling resistance. Exemplary insulator materials for the layer of tunnel barrier material 28L include, but are not limited to, magnesium oxide, aluminum oxide, and titanium oxide, or materials of higher electrical tunnel conductance, such as semiconductors or low-bandgap insulators. The thickness of the layer of tunnel barrier material 28L will depend on the material selected. In one example, the layer of tunnel barrier material 28L can have a thickness from 0.5 nm to 1.5 nm; although other thicknesses are possible as long as the thickness of the layer of tunnel barrier material 28L provides an appropriate tunneling resistance.

The layer of magnetic reference material 30L has a fixed magnetization. The layer of magnetic reference material 30L can be composed of a magnetic metal or magnetic metal alloy (or a stack thereof) that includes one or more magnetic metals exhibiting high spin polarization at the tunnel barrier interface. In alternative embodiments, exemplary magnetic metals for the formation of the layer of magnetic reference material 30L include iron, nickel, cobalt, chromium, boron, or manganese. Exemplary magnetic metal alloys can include the magnetic metals exemplified by the above for the layer of magnetic reference material 30L. In another embodiment, layer of magnetic reference material 30L can be a multilayer arrangement having (1) a high spin polarization region formed of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong intrinsic or bulk (as opposed to interface) PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the layer of magnetic reference material 30L.

In some embodiments, the layer of magnetic reference material 30L includes a multilayered structure that includes a lower magnetic reference layer, a synthetic anti-ferromagnetic coupling layer and an upper magnetic reference layer. The lower magnetic reference layer can be composed of one of the magnetic materials mentioned above for the layer of magnetic reference material 30L. The synthetic anti-ferromagnetic coupling layer can be composed of non-magnetic material that can couple in an anti-parallel fashion the lower and upper magnetic layers of this multilayered structure that can be employed as the layer of magnetic reference material 30L. Exemplary non-magnetic materials that can be used as the synthetic anti-ferromagnetic coupling layer include, but are not limited to, ruthenium (Ru), iridium (Ir) or rhodium (Rh). In one embodiment, the synthetic anti-ferromagnetic coupling layer can have a thickness from 0.2 nm to 1.2 nm; although other thicknesses are possible and can be used as the thickness of the synthetic anti-ferromagnetic coupling layer. The upper magnetic reference layer can be composed of one of the magnetic materials mentioned above for the magnetic reference layer 30L. Typically, and in this multilayered structure embodiment, the upper magnetic reference layer is compositionally different from the lower magnetic reference layer.

In some embodiments (not shown), a layer of MTJ capping material can be formed between the layer of magnetic reference material 30L and the top electrode layer 32. When present, the MTJ capping material can include, but it is not limited to, Nb, NbN, W, WN, Ta, TaN, Ti, TiN, Ru, Mo, Cr, V, Pd, Pt, Rh, Sc, Al or other high melting point metals or conductive metal nitrides. In some embodiments, a separate MTJ cap is not formed and a lower portion of the top electrode layer 32L can function as a capping layer. The layer of MTJ capping material can have a thickness from 2 nm to 25 nm; other thicknesses are possible and can be used in the present application as the thickness of the layer of MTJ capping material.

The top electrode layer 32L includes one of the conductive materials mentioned above for the bottom electrode 12. In one embodiment, the conductive material that provides the top electrode layer 32L is compositionally the same as the conductive material that provides the bottom electrode 12. In another embodiment, the conductive material that provides the top electrode layer 32L is compositionally different from the conductive material that provides the bottom electrode 12. The top electrode layer 32L can have a thickness from 5 nm to 100 nm; other thicknesses are possible and can be used in the present application as the thickness of the top electrode layer 32L.

Figure 4:
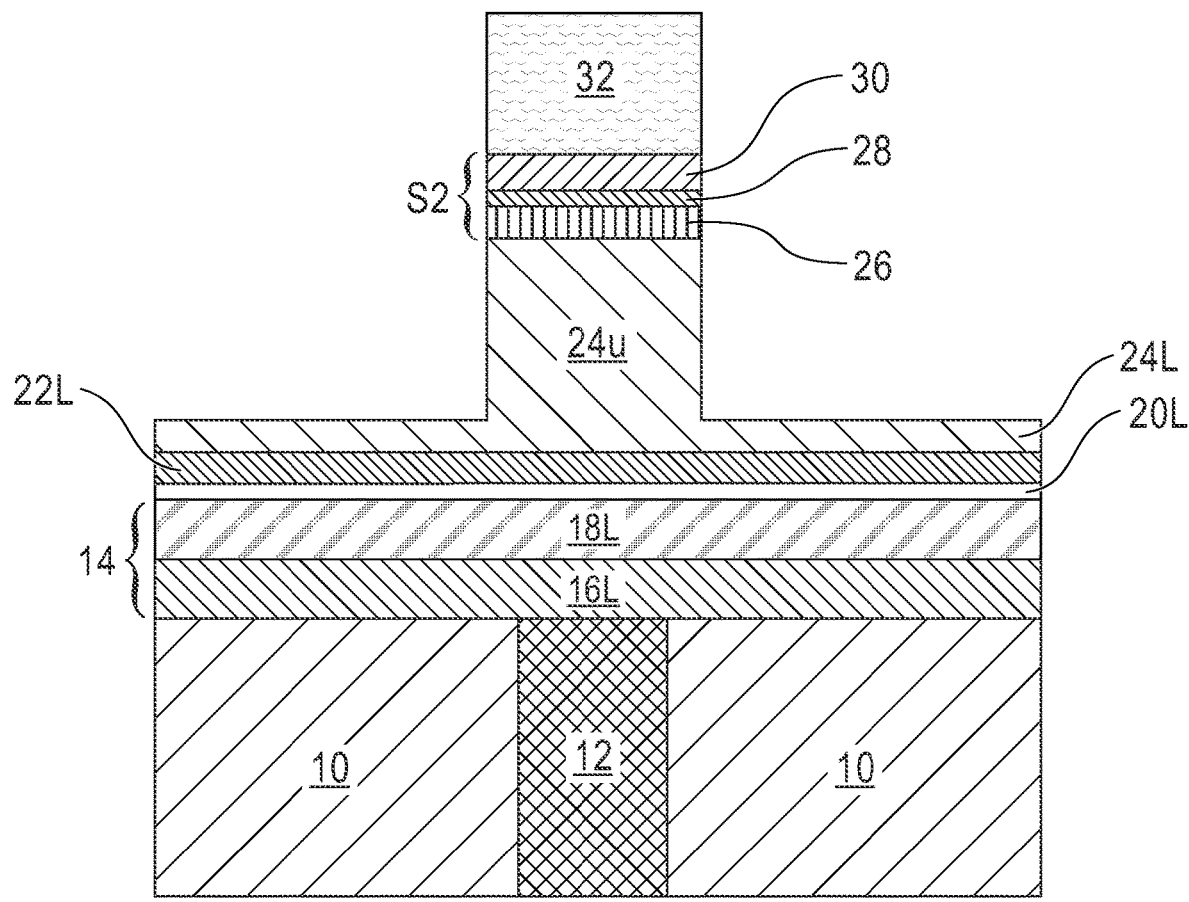
FIG. 4 is a cross sectional view of the exemplary structure shown in FIG. 3 after first patterning the top electrode layer, the MTJ stack and an upper portion of the layer of chemical templating material to provide a top electrode, a MTJ structure and an upper portion of a chemical templating layer, respectively, wherein the first patterning includes an etch that stops on, and thus physically exposes, a lower portion of the layer of chemical templating material.

Referring now to FIG. 4, there is illustrated the exemplary structure shown in FIG. 3 after first patterning the top electrode layer 32L, the MTJ stack S1, and an upper portion of the layer of chemical templating material 24L to provide a top electrode 32, a MTJ structure S2, and an upper portion of a chemical templating layer (the upper portion of the chemical templating layer is designated as element 24u in the drawings of the present application), respectively, wherein the first patterning includes an etch that stops on a surface a lower portion of the layer of chemical templating material 24L.

The first patterning includes a lithographic process in which a patterned resist (not shown) is formed on a surface of the top electrode layer 32L. The patterned resist can be formed by deposition of a photoresist material, exposing the photoresist material to a desired pattern of irradiation, and developing the exposed photoresist material. The patterned resist protects a portion of the top electrode layer 32L, while leaving other portions of the top electrode layer 32L physically exposed. The physically exposed portions of the top electrode layer 32L are removed in an initial transfer etch. After the transfer etch, the patterned resist is removed utilizing a conventional resist removal process such as, for example, ashing. The first patterning continues utilizing another etch in which the remaining top electrode layer 32L (hereinafter top electrode 32) servers as an etch mask for this first patterning process. This other etch stops on a surface a lower portion of the layer of chemical templating material 24L. This other etch removes portions of the MTJ stack S 1, and an upper portion of the layer of chemical templating material 24L that are not covered by the top electrode 32. The remaining portion of the MTJ stack S1 is referred hereinafter as a MTJ structure S2, and the remaining upper portion of the layer of chemical templating material 24L is hereinafter referred to as an upper chemical templating layer portion 24u.

The transfer etch and the subsequently performed etch can include ion beam etching, reactive ion beam etching or any combination thereof. The transfer etch can be the same as, or different from, the other etch used in this first patterning step. For example, the transfer etch can include reactive ion etching, and the other etch can include ion beam etching.

In some embodiments of the present application, the exemplary structure shown in FIG. 4 can be subjected to an oxygen treatment process or any other gas treatment process so as to remove any unwanted metallic particles that may have redeposited on the sidewalls of the MTJ structure S2 during the first patterning.

The MTJ structure S2 typically has a width that is the same as the width of the top electrode 32 and a width of the upper chemical templating layer portion 24u. In some embodiments, the MTJ structure S2, the top electrode 32 and the upper chemical templating layer portion 24u can be cylindrical in shape. The MTJ structure S2 includes remaining portions of each of the layer of magnetic free material 26L (hereinafter magnetic free layer 26), the layer of tunnel barrier material 28L (hereinafter tunnel barrier layer 28), and the layer of magnetic reference material 30L (hereinafter magnetic reference layer 30). In some embodiments, each of the magnetic free layer 26, the tunnel barrier layer 28, and the magnetic reference layer 30 has a sidewall that is vertically aligned to each other as well as being vertically aligned to the sidewall of the top electrode 32 and a sidewall of the upper chemical templating layer portion 24u. In other embodiments, the MTJ structure S2 can have a sloped profile with an angle of 1° to 45°.

Figure 5:
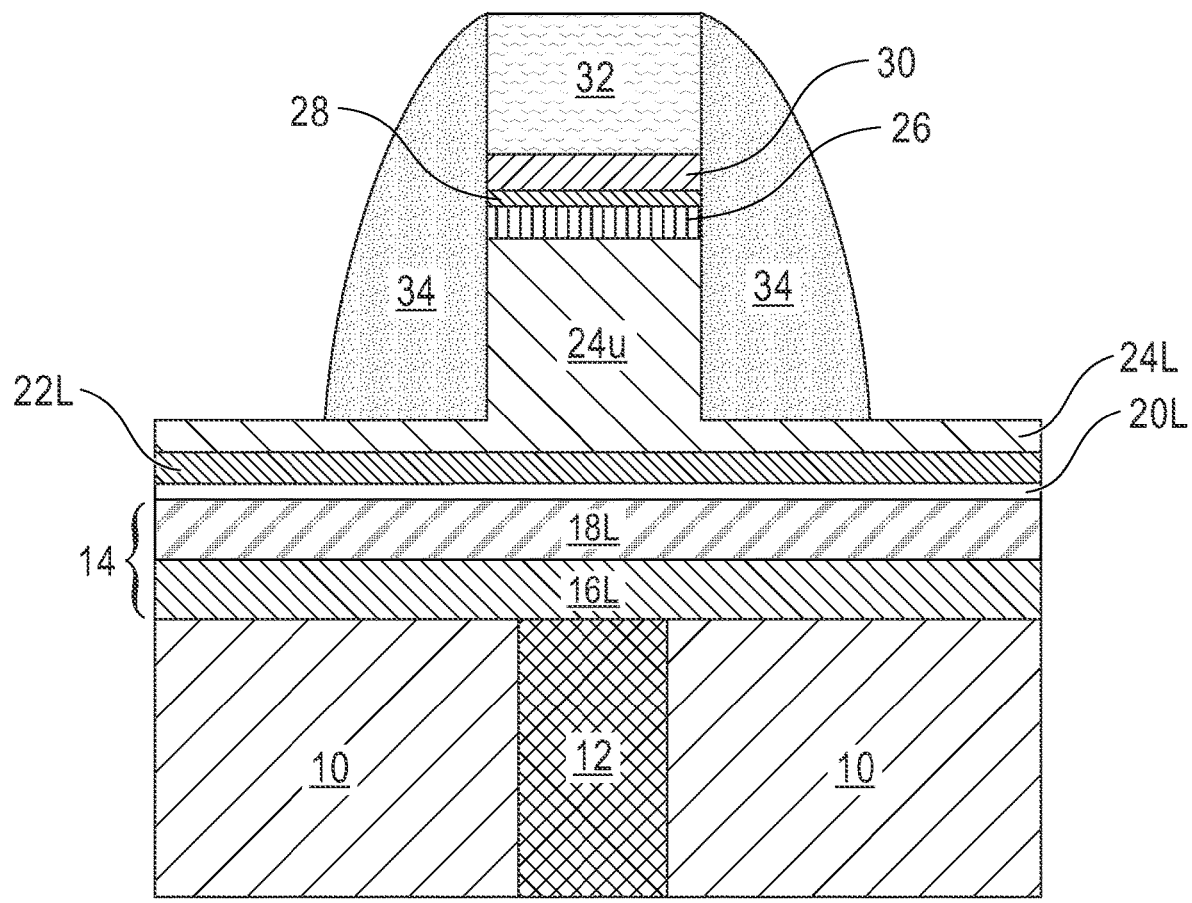
FIG. 5 is a cross sectional view of the exemplary structure shown in FIG. 4 after forming a dielectric spacer on the physically exposed lower portion of the layer of chemical templating material and laterally adjacent to the top electrode, the MTJ structure and the upper portion of the chemical templating layer.

Referring now to FIG. 5, there is illustrated the exemplary structure shown in FIG. 4 after forming a dielectric spacer 34 on the lower portion of the layer of chemical templating material 24L and laterally adjacent to the top electrode 32, the MTJ structure S2 and the upper portion of the chemical templating layer (i.e., the upper chemical templating layer portion 24u). As is shown in FIG. 5, dielectric spacer 34 has a bottommost surface that is in physical contact with a physically exposed surface of the lower portion of the layer of chemical templating material 24L and a vertical sidewall that is in direct physically contact with each of the top electrode 32, the MTJ structure S2 and the upper chemical templating layer portion 24u. The dielectric spacer 34 does not need to cover an entirety of the sidewall of the top electrode 32.

Dielectric spacer 34 can be composed of a dielectric spacer material such as, for example, silicon dioxide, silicon nitride, silicon oxynitride, or a low-k material. The term "low-k material" denotes a dielectric material that has a dielectric constant of less than 4.0 (all dielectric constants mentioned herein are relative to a vacuum, unless otherwise noted). An example of a low-k material that can be employed as a spacer dielectric material is a dielectric material containing atoms of Si, C, O and H. The dielectric spacer 34 can be formed by deposition of a dielectric spacer material, followed by a spacer etch. The depositing of the spacer dielectric material can include, but is not limited, to PVD or PECVD. The spacer etch can include a reactive ion etch or an ion beam etch. The dielectric spacer 34 can have an upper portion that has a first thickness and a lower portion that has a second thickness that is greater than the first thickness.

Figure 6:
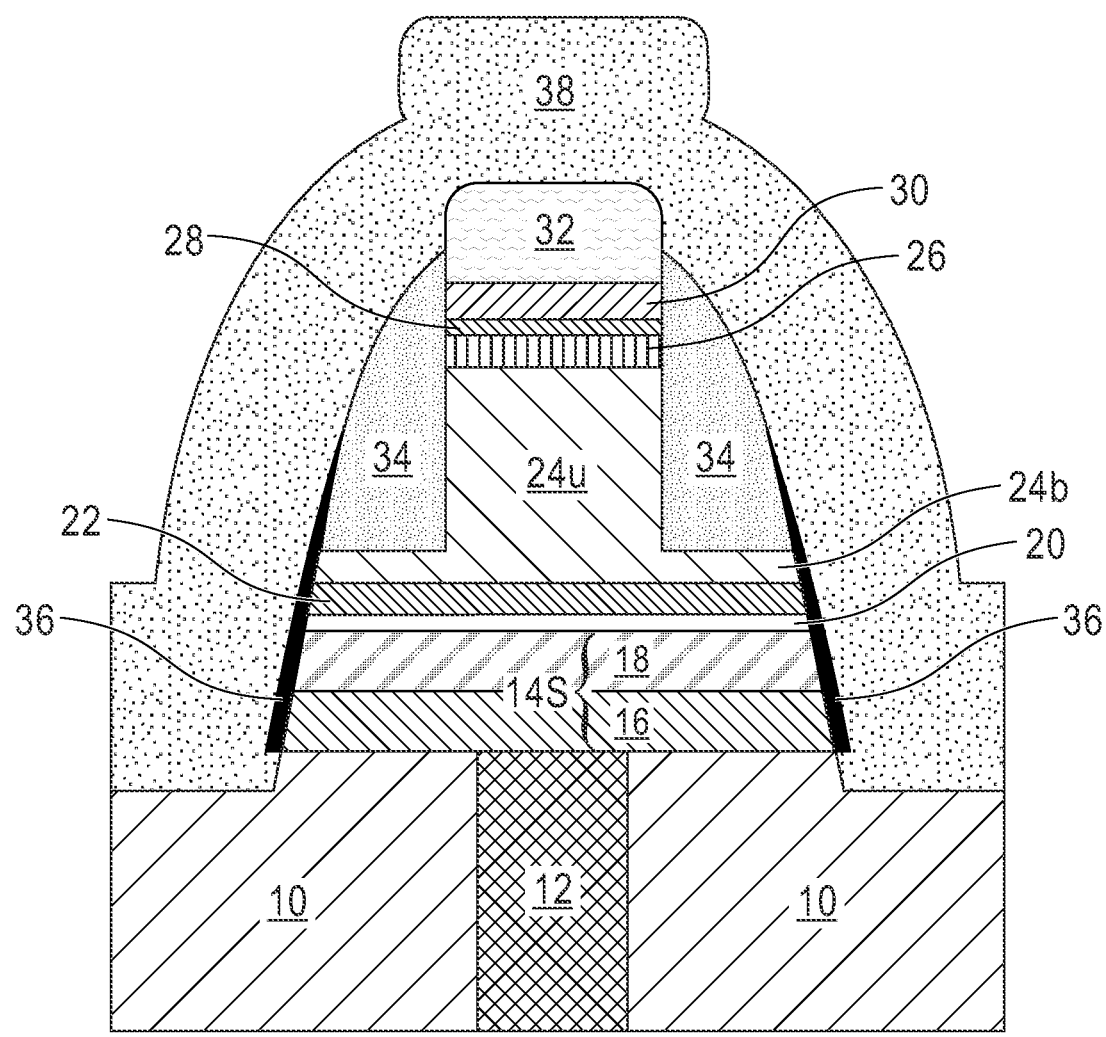
FIG. 6 is a cross sectional view of the exemplary structure shown in FIG. 5 after second patterning the lower portion of the layer of chemical templating material, the layer of tunnel barrier seed material, the layer of seed metal and the non-magnetic pedestal region using the dielectric spacer as an etch mask to provide a lower portion of the chemical templating layer, a tunnel barrier seed layer, a seed metal layer, and a non-magnetic pedestal structure, respectively, and thereafter forming an encapsulation layer.

Referring now to FIG. 6, there is illustrated the exemplary structure shown in FIG. 5 after second patterning the lower portion of the layer of chemical templating material 24L, the layer of tunnel barrier seed material 22L, the layer of seed metal 20L and the non-magnetic pedestal region 14 to provide a lower portion of the chemical templating layer (hereinafter lower chemical templating layer portion 24b), a tunnel barrier seed layer 22, a seed metal layer 20, and a non-magnetic pedestal structure 14S, respectively, and thereafter forming an encapsulation layer 38. In embodiments, the etch employed in the second patterning is an ion beam etch in which an angle of the ion beam etch is from 0° to 45°, more typically 0° to 25°, relative to a planar surface of the interconnect level including the bottom electrode 12. In some embodiments, a portion of the first interconnect dielectric material layer 10 may be recessed, as shown in FIG. 6, during the second patterning process.

It is noted that collectively the lower chemical templating layer portion 24b and the upper chemical templating layer portion 24u provide a chemical templating layer of the present application. As is shown, the upper chemical templating layer portion 24u of the chemical templating layer has a width that is less than a width of the lower chemical templating layer portion 24b of the chemical templating layer.

In embodiments, the non-magnetic pedestal structure 14S can include a bilayer structure including a remaining portion of the first non-magnetic metal-containing layer 16L (hereinafter first non-magnetic metal-containing base layer 16) and a remaining portion of the second non-magnetic metal-containing layer 18L (hereinafter second non-magnetic metal-containing base layer 18). The non-magnetic pedestal portion 14S has a width that is greater than a width of the MTJ structure S2. The width of the non-magnetic pedestal portion 14S can be the same or greater than the width of the seeding area including the seed metal layer 20 and the tunnel barrier seed layer 22. The width of the seeding area including the seed metal layer 20 and the tunnel barrier seed layer 22 is greater than the width of the MTJ structure S2. This increased width of the seeding area including the seed metal layer 20 and the tunnel barrier seed layer 22 relative to the MTJ structure S2 lowers the resistance of the memory structure of the present application. In some embodiments, in which the width of the seeding area is 3 times greater than the width of the MTJ structure S2 the resistance of the memory structure can decrease by about one order of order of magnitude.

The second patterning uses the dielectric spacer 34 as an etch mask and includes an etch that sputters non-oxidized metallic particles from the non-magnetic pedestal region 14 and redeposits the non-oxidized metallic particles onto a sidewall of at least the tunnel barrier seed layer 22. That is, the etch used in second patterning process forms a layer of non-oxidized metallic residue 36 on at least the sidewall of the tunnel barrier seed layer 22. This layer of non-oxidized metallic residue 36 intentionally shunts at least the seeding area; in the present application the seeding area is the area of the structure that includes the tunnel barrier seed layer 22 and the seed metal layer 20. The layer of non-oxidized metallic residue 36 forms a ring laterally adjacent to at least the seeding area. The layer of non-oxidized metallic residue 36 includes at least one metal such as, for example, Ta, that is present in non-magnetic pedestal structure 14S.

In addition to present on at least the seeding area and in some embodiments, the layer of non-oxidized metallic residue 36 can extend onto a sidewall of the lower portion of the chemical templating layer, i.e., the lower chemical templating layer portion 24b. In other embodiments, the layer of non-oxidized metallic residue 36 can also extend onto a sidewall of the dielectric spacer 34. In the illustrated embodiment shown in FIG. 6, the layer of non-oxidized metallic residue 36 extends onto a sidewall of each of the non-magnetic pedestal structure 14S, the lower portion of the chemical templating layer (i.e., the lower chemical templating layer portion 24b) and the dielectric spacer 34.

The layer of non-oxidized metallic residue 36 that is formed can be a continuous layer, or it can be a non-continuous layer including some gaps therein. The layer of non-oxidized metallic residue 36 can have a thickness from 0.1 nm to 3 nm.

The encapsulation layer 38 laterally surrounds the top electrode 32, the MTJ structure S2, the chemical templating layer (including the upper chemical templating layer portion 24u and the lower chemical templating layer portion 24b), the seeding area, and the non-magnetic pedestal structure 14S. The encapsulation layer 38 is also formed over the top electrode 32 and on a surface of the first interconnect dielectric material layer 10.

The encapsulation layer 38 is composed of a dielectric material that can provide passivation to the top electrode 32 and the MTJ structure S2. In one embodiment, the encapsulation layer 38 is composed of silicon nitride. In another embodiment, the encapsulation layer 38 can be composed of a dielectric material that contains atoms of silicon, carbon and hydrogen. In some embodiments, and in addition to atoms of carbon and hydrogen, the dielectric material that provides the encapsulation layer 38 can include atoms of at least one of nitrogen and oxygen. In other embodiments, and in addition to atoms of silicon, nitrogen, carbon and hydrogen, the dielectric material that provides the encapsulation layer 38 can include atoms of boron. In one example, the encapsulation layer 38 can be composed of an nBLOK dielectric material that contains atoms of silicon, carbon, hydrogen, nitrogen and oxygen. In alternative example, the encapsulation layer 38 can be composed of a SiBCN dielectric material that contains atoms of silicon, boron, carbon, hydrogen, and nitrogen.

The encapsulation layer 38 can be formed by deposition a continuous layer of the dielectric material that provides the encapsulation layer 38. The depositing can include, but is not limited to, CVD, PECVD, PVD, ALD or spin-on coating. The encapsulation layer 38 can have a thickness from 10 nm to 200 nm. Other thicknesses are possible and can be employed as the thickness of the encapsulation layer 38.

Figure 7:
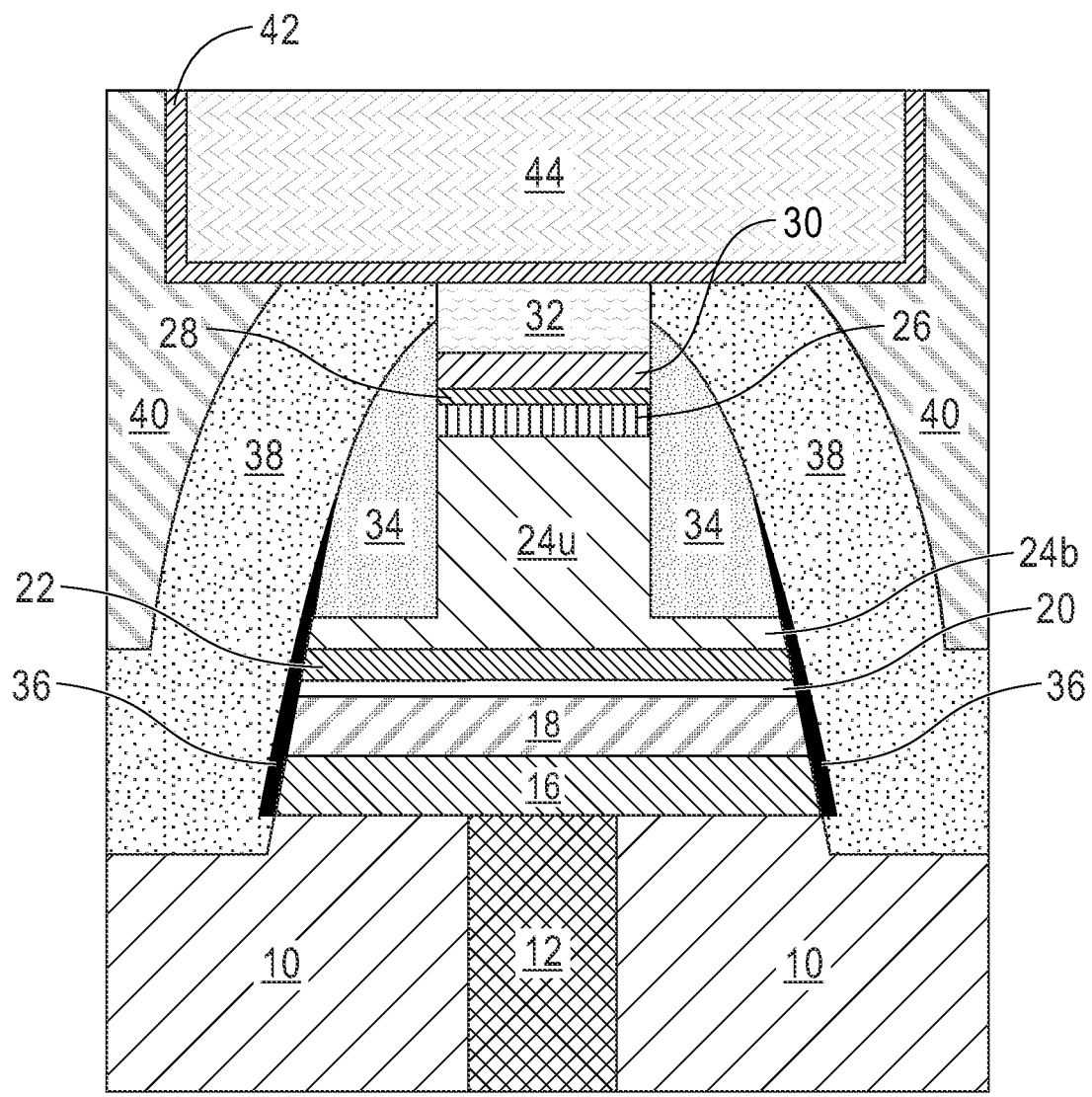
FIG. 7 is a cross sectional view of the exemplary structure shown in FIG. 6 after forming a second interconnect dielectric material layer and forming an electrically conductive structure in the second interconnect dielectric material layer and contacting a topmost surface of MTJ structure.

Referring now FIG. 7, there is illustrated the exemplary structure shown in FIG. 6 after forming a second interconnect dielectric material layer 40 and forming an electrically conductive structure 44 in the second interconnect dielectric material layer 40 and contacting the top electrode 32. The second interconnect dielectric material layer 40 can include one of the dielectric materials mentioned above for the first interconnect dielectric material layer 10. The dielectric material that provides the second interconnect dielectric material layer 40 can be compositionally the same as, or compositionally different from, the dielectric material that provides the first interconnect dielectric material layer 10. The second interconnect dielectric material layer 40 can be formed utilizing one of the deposition processes mentioned above for forming the first interconnect dielectric material layer 10. A planarization can follow the deposition process. As is shown, the second interconnect dielectric material layer 40 is located laterally adjacent to and above the encapsulation layer 38.

The electrically conductive structure 44 is composed of a contact metal or a contact metal alloy such as, for example, Cu, Al, W, Co or alloys thereof. In some embodiments, a diffusion barrier liner 42 is formed along the sidewall and a bottom wall of the electrically conductive structure 44. In some embodiments, no diffusion barrier liner is present. The diffusion barrier liner 42 is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN.

The electrically conductive structure 44 and the optional diffusion barrier liner 42 can be formed by first providing a contact opening in the second interconnect dielectric material layer 40 which extends down and physically exposes at least a topmost surface of the top electrode 32. The contact opening can be formed by photolithography and etching. Next, an optional diffusion barrier material layer and a contact metal-containing layer are formed inside and outside the contact opening. Next, a planarization process is used to remove the optional diffusion barrier material layer and a contact metal-containing layer that are formed outside the contact opening, while maintaining the optional diffusion barrier material layer and the contact metal-containing layer are formed inside the contact opening. The maintained optional diffusion barrier layer provides the optional diffusion barrier liner 42, while the maintained contact metal-containing layer provides the electrically conductive structure 44.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A memory structure comprising:
   a bottom electrode embedded in a first interconnect dielectric material layer;
   a non-magnetic pedestal structure located on the bottom electrode and a portion of the first interconnect dielectric material layer;
   a seeding area having a first width and located on the non-magnetic pedestal structure, wherein the seeding area comprises at least a tunnel barrier seed layer;
   a chemical templating layer located on the seeding area;

a magnetic tunnel junction (MTJ) structure having a second width and located on the chemical templating layer, wherein the second width is less than the first width;

a top electrode located on the MTJ structure; and a layer of non-oxidized metallic residue located on at least a sidewall of the tunnel barrier seed layer and intentionally shunting at least the seeding area.

2. The memory structure of claim 1, wherein the chemical templating layer comprises an upper portion and a lower portion, wherein the lower portion has a width that is greater than the upper portion and forms an interface with the tunnel barrier seed layer.

3. The memory structure of claim 2, further comprising a dielectric spacer located on a sidewall of the MTJ structure and the top electrode, and having a bottommost surface that is located on the lower portion of the chemical templating layer.

4. The memory structure of claim 3, further comprising an encapsulation layer located laterally adjacent to the dielectric spacer, the seeding area and the non-magnetic pedestal structure, and having a bottommost surface located on a surface of the first interconnect dielectric material layer.

5. The memory structure of claim 4, further comprising a second interconnect dielectric material layer located laterally adjacent to, and above, the encapsulation layer.

6. The memory structure of claim 5, further comprising an electrically conductive structure embedded in the second interconnect dielectric material layer and contacting the top electrode.

7. The memory structure of claim 6, wherein the electrically conductive structure has a third width that is greater than at least the second width of the MTJ structure.

8. The memory structure of claim 1, wherein the layer of non-oxidized metallic residue extends onto a sidewall of the non-magnetic pedestal structure.

9. The memory structure of claim 1, wherein the layer of non-oxidized metallic residue extends onto a sidewall of a lower portion of the chemical templating layer.

10. The memory structure of claim 9, wherein the layer of non-oxidized metallic residue extends onto a sidewall of a dielectric spacer that is located laterally adjacent to at least the MTJ structure.

11. The memory structure of claim 1, wherein the layer of non-oxidized metallic residue extends onto a sidewall of each of the non-magnetic pedestal structure, the lower portion of the chemical templating layer and a dielectric spacer that is located laterally adjacent to at least the MTJ structure.

12. The memory structure of claim 1, wherein the seeding area further comprises a seed metal layer located beneath the tunnel barrier seed layer.

13. The memory structure of claim 1, wherein the MTJ structure is a top pinned MTJ structure comprising, from bottom to top, a magnetic free layer, a tunnel barrier layer and a magnetic reference layer.

14. The memory structure of claim 13, wherein the magnetic free layer comprises an ordered magnetic alloy.

15. The memory structure of claim 14, wherein the ordered magnetic alloy is a Heusler alloy or a L10 alloy.

16. The memory structure of claim 13, wherein the magnetic reference layer comprises a single magnetic reference layer.

17. The memory structure of claim 13, wherein the magnetic reference layer comprises a lower magnetic reference layer, a synthetic anti-ferromagnetic coupling layer and an upper magnetic reference layer.

18. The memory structure of claim 1, wherein the non-magnetic pedestal structure has a width that is greater than at least the second width of the MTJ structure, and the top electrode has a width that is equal to the second width of the MTJ structure.

19. The memory structure of claim 1, wherein the layer of non-oxidized metallic residue comprises at least one metal that is present in non-magnetic pedestal structure.

20. The memory structure of claim 1, wherein the chemical templating layer is a crystallization setting layer for a magnetic free layer of the MTJ structure.

21. The memory structure of claim 1, wherein the tunnel barrier seed layer has a thickness sufficient to induce magnetic or crystallographic order to a magnetic free layer of the MTJ structure.

* * * * *